(12) United States Patent
Nguyen et al.

(10) Patent No.: US 7,491,658 B2
(45) Date of Patent: Feb. 17, 2009

(54) ULTRA LOW K PLASMA ENHANCED CHEMICAL VAPOR DEPOSITION PROCESSES USING A SINGLE BIFUNCTIONAL PRECURSOR CONTAINING BOTH A SICOH MATRIX FUNCTIONALITY AND ORGANIC POROGEN FUNCTIONALITY

(75) Inventors: Son Van Nguyen, Yorktown Heights, NY (US); Stephen McConnell Gates, Ossining, NY (US); Deborah A. Neumayer, Danbury, CT (US); Alfred Grill, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/964,254

(22) Filed: Oct. 13, 2004

(65) Prior Publication Data

US 2006/0079099 A1    Apr. 13, 2006

(51) Int. Cl.
*H01L 21/31* (2006.01)
(52) U.S. Cl. ............... 438/789; 438/623; 438/781; 438/790; 257/E21.273; 257/E21.277
(58) Field of Classification Search .......... 438/623, 438/780, 781, 789, 788, 790, 773; 257/E21.273, 257/E21.274, E21.277
See application file for complete search history.

(56) References Cited

U.S. PATENT DOCUMENTS

| | | | |
|---|---|---|---|
| 2005/0196974 A1* | 9/2005 | Weigel et al. | 438/780 |
| 2005/0230834 A1* | 10/2005 | Schmitt et al. | 257/758 |
| 2006/0006140 A1* | 1/2006 | Lakshmanan et al. | 216/67 |
| 2006/0151884 A1* | 7/2006 | Hara et al. | 257/759 |

* cited by examiner

*Primary Examiner*—George Fourson
*Assistant Examiner*—Julio J. Maldonado
(74) *Attorney, Agent, or Firm*—Scully, Scott, Murphy & Presser, P.C.; Robert M. Trepp, Esq.

(57) ABSTRACT

A method for fabricating a SiCOH dielectric material comprising Si, C, O and H atoms from a single organosilicon precursor with a built-in organic porogen is provided. The single organosilicon precursor with a built-in organic porogen is selected from silane ($SiH_4$) derivatives having the molecular formula $SiRR^1R^2R^3$, disiloxane derivatives having the molecular formula $R^4R^5R^6$—Si—O—Si—$R^7R^8R^9$, and trisiloxane derivatives having the molecular formula $R^{10}R^{11}R^{12}$—Si—O—Si—$R^{13}R^{14}$—O—Si—$R^{15}R^{16}R^{17}$ where R and $R^{1-17}$ may or may not be identical and are selected from H, alkyl, alkoxy, epoxy, phenyl, vinyl, allyl, alkenyl or alkynyl groups that may be linear, branched, cyclic, polycyclic and may be functionalized with oxygen, nitrogen or fluorine containing substituents. In addition to the method, the present application also provides SiCOH dielectrics made from the inventive method as well as electronic structures that contain the same.

16 Claims, 3 Drawing Sheets

ULTRA LOW K PLASMA ENHANCED CHEMICAL VAPOR DEPOSITION PROCESSES USING A SINGLE BIFUNCTIONAL PRECURSOR CONTAINING BOTH A SICOH MATRIX FUNCTIONALITY AND ORGANIC POROGEN FUNCTIONALITY

CROSS-REFERENCE TO RELATED APPLICATIONS

The present application is related to co-assigned U.S. Pat. Nos. 6,147,009, 6,312,793, 6,441,491, 6,437,443, 6,541,398, 6,479,110 B2 and 6,497,963, the entire contents of each of the aforementioned U.S. patents are incorporated herein by reference. The present application is also related to the following co-pending and co-assigned U.S. patent applications Ser. No. 10/174,749, filed Jun. 19, 2002, Ser. No. 10/340,000, filed Jan. 23, 2003, Ser. No. 10/390,801, filed Mar. 18, 2003, and Ser. No. 10/758,724, filed Jan. 16, 2004. The contents of each of the aforementioned U.S. Patent Applications are also incorporated herein by reference in their entirety as well.

FIELD OF THE INVENTION

The present invention generally relates to a method of fabricating a dielectric material that has an ultralow dielectric constant (or ultralow k) using a plasma enhanced chemical vapor deposition (PECVD) process in which a single organosilicon precursor containing a built-in organic porogen is employed as well as a method of fabricating electronic devices containing such a dielectric material. The use of a single precursor in a PECVD process enables easier control of the process, better control of film thickness and compositional uniformity and simplifies the manufacturing process. Moreover, the deposition of a dielectric film from a single precursor enables better control of the final porosity in the film and a narrower pore size distribution resulting in better mechanical properties at the same value of dielectric constant.

More particularly, the present invention relates to a method of fabricating a thermally stable ultralow k dielectric film for use as an intralevel or interlevel dielectric in an ultra large scale integration (ULSI) back-end-of-the-line (BEOL) wiring structure and an electronic structure formed by such a method.

BACKGROUND OF THE INVENTION

The continuous shrinking in dimensions of electronic devices utilized in ULSI circuits in recent years has resulted in increasing the resistance of the BEOL metallization as well as increasing the capacitance of the intralayer and interlayer dielectric. This combined effect increases signal delays in ULSI electronic devices. In order to improve the switching performance of future ULSI circuits, low dielectric constant (k) insulators and particularly those with k significantly lower than silicon oxide are needed to reduce the capacitances. Dielectric materials (i.e., dielectrics) that have low k values are commercially available. One such commercially available material, for example, is polytetrafluoroethylene ("PTFE"), which has a dielectric constant of about 2.0. Most commercially available dielectric materials however are not thermally stable when exposed to temperatures above 300° C. Integration of low k dielectrics in present ULSI chips requires a thermal stability of at least 400° C.

The low k materials that have been considered for applications in ULSI devices include polymers containing elements of Si, C, O and H, such as methylsiloxane, methylsilsesquioxanes, and other organic and inorganic polymers. For instance, an article by N. Hacker et al. "Properties of new low dielectric constant spin-on silicon oxide based dielectrics" Mat. Res. Soc. Symp. Proc. 476 (1997): 25 describes materials that appear to satisfy the thermal stability requirement, even though some of these materials propagate cracks easily when reaching thicknesses needed for integration in an interconnect structure when films are prepared by a spin-on technique. Furthermore, these prior art precursor materials are high cost and prohibitive for use in mass production. Moreover, most of the fabrication steps of very large scale integration ("VLSI") and ULSI chips are carried out by plasma enhanced chemical or physical vapor deposition techniques.

The ability to fabricate a low k material by a plasma enhanced chemical vapor deposition (PECVD) technique using previously installed and available processing equipment will thus simplify its integration in the manufacturing process, reduce manufacturing cost, and create less hazardous waste. U.S. Pat. Nos. 6,147,009 and 6,497,963 describe a low dielectric constant material consisting of elements of Si, C, O and H atoms having a dielectric constant of not more than 3.6 and which exhibits very low crack propagation velocities.

U.S. Pat. Nos. 6,312,793, 6,441,491, 6,541,398 and 6,479,110 B2 describe a multiphase low k dielectric material that consists of a matrix phase composed of elements of Si, C, O and H and another phase composed mainly of C and H. The dielectric materials disclosed in the foregoing patents have a dielectric constant of not more than 3.2.

U.S. Pat. No. 6,437,443 describes a low k dielectric material that has two or more phases wherein the first phase is formed of a SiCOH material. The low k dielectric material is provided by reacting a first precursor gas containing atoms of Si, C, O, and H and at least a second precursor gas containing mainly atoms of C, H, and optionally F, N and O in a plasma enhanced chemical vapor deposition chamber.

Despite the numerous disclosures of low k dielectric materials, there is a continued need to improve the PECVD process in order to improve the properties of the final SiCOH dielectric material. For example, a SiCOH dielectric material having a lower internal stress, improved thermal stability, lower cost and better process control within processing temperatures used in current ULSI technologies are all needed.

It is commonly found that SiCOH dielectric materials made in the prior art from two or more separate organosilicon and/or porogen precursors are not uniform in atomic and structural composition, both when measured across the substrate diameter, and through the depth of the layer. The use of 300 mm Si wafers has made this problem of chemical uniformity across the wafer more pronounced.

It is also commonly found that SiCOH dielectric materials made from two or more separate organosilicon and/or porogen precursors exhibit process variation or process instability due to small changes in the flow rate of one of the two precursors, known as drift in the flow rate.

In view of the above, there is a need to provide a process to fabricate a layer of a SiCOH dielectric material having improved film properties, that is uniform in atomic and structural composition, both when measured across the substrate diameter, and through the depth of the layer, which does not exhibit any variation in the process or process instability.

SUMMARY OF THE INVENTION

The present invention provides a method for fabricating a dielectric material having a dielectric constant of not more than about 2.7 from a single organosilicon precursor with a built-in organic porogen. More preferably, the dielectric constant of the ultralow k material of the present invention is from about 1.5 to about 2.6, and most preferably, the dielectric constant is from about 1.8 to 2.5. All dielectric constants mentioned in the present application are relative to a vacuum unless otherwise specified.

The present invention also provides a method for fabricating a SiCOH dielectric material comprising Si, C, O and H atoms from a single organosilicon precursor with a built-in organic porogen. The single organosilicon precursor with a built-in organic porogen is selected from silane ($SiH_4$) derivatives having the molecular formula $SiRR^1R^2R^3$, disiloxane derivatives having the molecular formula $R^4R^5R^6Si$—O—$Si$—$R^7R^8R^9$, and trisiloxane derivatives having the molecular formula $R^{10}R^{11}R^{12}$—$Si$—O—$Si$—$R^{13}R^{14}$—O—$Si$—$R^{15}R^{16}R^{17}$ where R and $R^{1-17}$ may or may not be identical and are selected from H, alkyl, alkoxy, epoxy, phenyl, vinyl, allyl, alkenyl or alkynyl groups that may be linear, branched, cyclic, polycyclic and may be functionalized with oxygen, nitrogen or fluorine containing substituents.

Specifically, the present invention provides a PECVD process for fabricating a layer of a SiCOH dielectric material having improved film properties, that is uniform in atomic and structural composition, both when measured across the substrate diameter, and through the depth of the layer, which does not exhibit variation in the process or process instability.

By "uniform in atomic composition", it is meant that the dielectric material has a substantially constant atom distributed throughout the film in both the vertical and horizontal direction. By "uniform in structural composition", it is meant a substantially constant arrangement of atoms within the film in both the vertical and horizontal directions.

The use of a single organosilicon precursor in a PECVD process enables easier control of the process, better control of film thickness and compositional uniformity and simplifies the manufacturing process. Furthermore, the deposition of a film from a single organosilicon precursor enables better control of the final porosity in the film and a narrower pore size distribution, potentially resulting in better mechanical properties at the same values of dielectric constant. Furthermore, the deposition of a film from a single organosilicon precursor enables better control of the mechanical properties of the final SiCOH dielectric because the bonding in the final film is closely related to the bonding in the single organosilicon precursor with a built-in organic porogen.

In broad terms, the method (or process) of the present invention comprises the steps of:

positioning a substrate in a PECVD reactor;

providing a single organosilicon precursor with a built-in organic porogen into said PECVD reactor, said single organosilicon precursor with a built-in organic porogen comprising a silane derivative having the molecular formula $SiRR^1R^2R^3$, a disiloxane derivative having the molecular formula $R^4R^5R^6$—$Si$—O—$Si$—$R^7R^8R^9$, or a trisiloxane derivative having the molecular formula $R^{10}R^{11}R^{12}Si$—O—$Si$—$R^{13}R^{14}$—O—$Si$—$R^{15}R^{16}R^{17}$ where R and $R^{1-17}$ may or may not be identical and are selected from H, alkyl, alkoxy, epoxy, phenyl, vinyl, allyl, alkenyl or alkynyl groups that may be linear, branched, cyclic, polycyclic and may be functionalized with oxygen, nitrogen or fluorine containing substituents;

forming an as deposited film from said single organsilicon precursor, said as deposited film comprising a SiCOH matrix component and an organic porogen component; and performing a treatment step that substantially removes said organic porogen component from said as deposited film thereby providing a SiCOH dielectric material having a dielectric constant of about 2.7 or lower.

In addition to the method described above, the present invention also provides a SiCOH dielectric film which is prepared using the method described above. Specifically, the dielectric film of the present invention comprises a dielectric material comprising atoms of Si, C, O and H, said dielectric material having a covalently bonded tri-dimensional network structure, a dielectric constant of not more than 2.7, a controlled porosity having molecular scale voids from about 0.5 to about 20 nanometers in diameter, and preferably from about 0.5 to about 5 nm in diameter. According to the invention, the molecular scale voids occupy a volume of between about 5% and about 60%. Also according to the invention, the dielectric material of this invention contains molecular scale voids that are characterized by a pore size distribution and said size distribution has a maximum (in the distribution) between 0.7 and 3 nm, and preferably between 0.7 and 2.5 nm.

The present invention also relates to electronic structures that include at least one insulating material that comprises the SiCOH dielectric film of the present invention. The at least one dielectric film comprising the inventive SiCOH dielectric may comprise an interlevel and/or intralevel dielectric layer, a capping layer, and/or a hard mask/polish-stop layer in an electronic structure.

DETAILED DESCRIPTION OF THE INVENTION

The present invention, which describes a method of fabricating a SiCOH dielectric material using a single organosilicon precursor containing a built-in organic porogen, a SiCOH dielectric film formed by the inventive method and electronic structures containing the same, will now be described in greater detail.

Figure 1A:
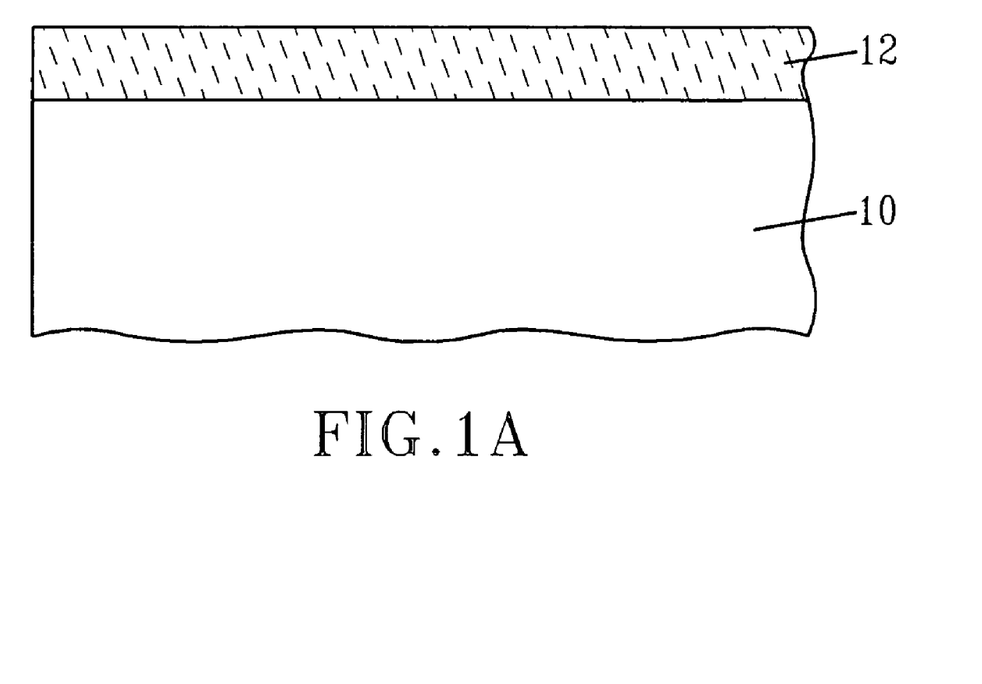
FIGS. 1A-1B are pictorial representations (through cross sectional views) illustrating the basic processing steps of the present invention.

In accordance with the method of the present invention, an as deposited dielectric film 12 is formed on a surface of a substrate 10 such as shown, for example, in FIG. 1A. The term "substrate" when used in conjunction with substrate 10 includes, a semiconducting material, an insulating material, a conductive material or any combination thereof, including multilayered structures. Thus, for example, substrate 10 can be a semiconducting material such as Si, SiGe, SiGeC, SiC, GaAs, InAs, InP and other III/V or II/VI compound semiconductors. The semiconductor substrate 10 can also include a layered substrate such as, for example, Si/SiGe, Si/SiC, silicon-on-insulators (SOIs) or silicon germanium-on-insulators (SGOIs). When substrate 10 is an insulating material, the insulating material can be an organic insulator, an inorganic insulator or a combination thereof including multilayers. When the substrate 10 is a conductive material, the substrate 10 may include, for example, polySi, an elemental metal, alloys of elemental metals, a metal silicide, a metal nitride and combinations thereof, including multilayers.

In some embodiments, the substrate 10 includes a combination of a semiconducting material and an insulating material, a combination of a semiconducting material and a conductive material or a combination of a semiconducting material, an insulating material and a conductive material. An example of a substrate that includes a combination of the above is an interconnect structure.

The as deposited dielectric film 12 is formed in the present invention utilizing a plasma enhanced chemical vapor deposition (PECVD) reactor in which a single organosilicon precursor containing a built-in organic porogen is employed. The thickness of the as deposited dielectric film 12 may vary; typical ranges for the deposited dielectric film 12 are from about 50 nm to about 1 μm, with a thickness from 100 to about 500 nm being more typical.

Typically, the dielectric film 12 is deposited using the processing techniques disclosed in co-assigned U.S. Pat. Nos. 6,147,009, 6,312,793, 6,441,491, 6,437,443, 6,441,491, 6,541,398, 6,479,110 B2, and 6,497,963, the contents of which are incorporated herein by reference, with the exception that a single organosilicon precursor containing a built-in organic porogen (to be described in greater detail herein below) is employed.

Specifically, the as deposited dielectric film 12 is formed by providing the single organosilicon precursor containing a build-in organic porogen and an optional inert carrier such as He, Ne, or Ar, into a reactor, preferably the reactor is a PECVD reactor, and then depositing a film derived from said precursor onto a suitable substrate utilizing conditions that are effective in forming a dielectric material. The substrate is positioned within the PECVD reactor on top of a substrate holder. The present invention yet further provides for mixing the precursor with an oxidizing agent such as $O_2$, $CO_2$ or a combination thereof, thereby stabilizing the reactants in the reactor and improving the uniformity of the dielectric film 12 deposited on the substrate 10.

The single organosilicon precursor with a built-in organic porogen is selected from silane ($SiH_4$) derivatives having the molecular formula $SiRR^1R^2R^3$, disiloxane derivatives having the molecular formula $R^4R^5R^6$—Si—O—Si—$R^7R^8R^9$, and trisiloxane derivatives having the molecular formula $R^{10}R^{11}R^{12}Si$—O—$SiR^{13}R^{14}$—O—Si—$R^{15}R^{16}R^{17}$ where R and $R^{1-17}$ may or may not be identical and are selected from H, alkyl, alkoxy, epoxy, phenyl, vinyl, allyl, alkenyl or alkynyl groups that may be linear, branched, cyclic, polycyclic and may be functionalized with oxygen, nitrogen or fluorine containing substituents.

Preferred single organosilicon precursor with a built-in organic porogen include, but are not limited to: allylazadimethoxysilacyclopentane, allylaminopropyltrimethoxysilane, allyldimethoxysilane, allyldimethylsilane, allyloxy-t-butyldimethylsilane, allyloxytrimethylsilane, allyltetramethyldisiloxane, allyltriethoxysilane, allyltrimethoxysilane, bicycloheptenylethyltrimethoxysilane, bicycloheptenyltriethoxysilane, bisallyloxymethyltrimethylsiloxybutane, bisbicycloheptenylethyltetramethyldisiloxane, bisepoxycyclohexylethyltetramethyldisiloxane, bistrimethylsilyloxycyclobutene, bis(trimethoxysilyl)ethane, bis(tri-methoxysilyl)decane, bis(trimethoxysilyl)hexane, butenyltriethoxysilane, butenyltrimethylsilane, (t-butyldimethylsiloxy)butyne, cyclohexenylethyltriethoxysilane, cyclohexenyltrimethoxysilane, cyclohexyltrimethoxysilane, cyclopentadienylpropyltriethoxysilane, cyclopenenyloxytrimethylsilane, cyclopentyltrimethoxysilane, diallyltetramethyldisiloxane, diethoxysilacyclopentene, diethyldiethoxysilane, dimethyldiethoxysilane, dimethyldimethoxysilane, dimethylbutylideneaminopropyltriethoxysilane, dimethylsilaoxacyclohexane, divinyldiphenyldimethyldisiloxane, divinyldiphenyltetramethyldisiloxane, divinyltetraphenyldisiloxane, 2-(3,4-epoxycyclohexyl)ethyltriethoxysilane, 2-(3,4-epoxycyclohexyl)ethyltrimethoxysilane, 5,6-epoxyhexyltriethoxysilane, propargyloxytrimethylsilane, divinyltetramethyldisiloxane, divinyldimethylsilane, hexavinyldisiloxane, hexaphenyldisiloxane, di-tert-butyldimethoxysilane, hexamethyltrisiloxane, hexamethylcyclotrisiloxane, methyltriethoxysilane, methyltrimethoxysilane, octeyltrimethoxysilane, octenyldimethylsilane, octyltrimethoxysilane, propenyltrimethylsilane, tetraallylsilane, tetramethyldisiloxane, tetravinyldimethyldisiloxane, tetravinylsilane, trimethylsilylcyclopentene, trivinylcyclotrisiloxane, trivinyltrisiloxane, trivinyltrimethylcyclotrisiloxane, trivinylpentamethyltrisiloxane, glycidoxypropyltrimethoxysilane, glycidoxypropylmethyldiethoxysilane, tetraethoxydimethyldisiloxane, tetraisopropyldisiloxane, trivinylmethoxysilane, trivinylethoxysilane, trivinylsilane, vinyldimethylethoxysilane, vinylmethyldiethoxysilane, vinylmethyldimethoxysilane, vinylmethylethoxysilane, vinylmethyldiethoxysilane, vinylmethyldimethoxysilane, vinylpentamethyldisiloxane, vinyltetramethyldisiloxane, vinyltri-t-butoxysilane, vinyltriethoxysilane, vinyltriisopropenoxysilane, vinyltriisopropoxysilane, vinyltrimethoxysilane ethoxytrimethylsilane, ethoxydimethylsilane, dimethoxydimethylsilane, dimethoxymethylsilane, triethoxysilane, and trimethoxymethylsilane.

In a preferred embodiment, the organosilicon precursor with a built-in organic porogen is vinylmethyldiethoxysilane, vinyltriethoxysilane, vinyldimethylethoxysilane, cyclohexenylethyltriethoxysilane, 1,1-diethoxy-1-silacyclopent-3-ene, divinyltetramethyldisiloxane, 2-(3,4-epoxycyclohexyl)ethyltriethoxysilane, 2-(3,4-epoxycyclohexyl)ethyltrimethoxysilane, epoxyhexyltriethoxysilane, hexavinyldisiloxane, trivinylmethoxysilane, trivinylethoxysilane, vinylmethylethoxysilane, vinylmethyldiethoxysilane, vinylmethyldimethoxysilane, vinylpentamethyldisiloxane, vinyltetramethyldisiloxane, vinyltriethoxysilane, or vinyltrimethoxysilane.

The as deposited dielectric film 12 may be deposited using a method the includes the step of providing a parallel plate reactor, which has a conductive area of a substrate chuck between about 85 $cm^2$ and about 750 $cm^2$, and a gap between the substrate and a top electrode between about 1 cm and about 12 cm. A high frequency RF power is applied to one of the electrodes at a frequency between about 0.45 MHz and about 200 MHz. Optionally, an additional low frequency power can be applied to one of the electrodes.

The conditions used for the deposition step may vary depending on the desired final dielectric constant of the dielectric film. Broadly, the conditions used for providing a stable dielectric material comprising elements of Si, C, O, H that has a dielectric constant of about 2.7 or less include: setting the substrate temperature at between about 200° C. and about 425° C.; setting the high frequency RF power density at between about 0.1 $W/cm^2$ and about 2.5 $W/cm^2$;

setting the single organosilicon precursor flow rate at between about 100 mg/min and about 5000 mg/min, optionally setting the inert carrier gases such as helium (and/or argon) flow rate at between about 50 sccm to about 5000 sccm; and setting the reactor pressure at a pressure between about 1000 mTorr and about 10000 mTorr. Optionally, a low frequency power may be added to the plasma between about 30 W and about 400 W. Note that the RF power may be replaced with another energy source which is also capable of dissociating the precursor. For organosilicon gas precursors, the flow rate is between about 20 sccm to about 3000 sccm with the same reactor pressure between about 1000 mTorr and about 10000 mTorr.

When an oxidizing agent is employed in the present invention, it is flown into the PECVD reactor at a flow rate between about 10 sccm to about 1000 sccm.

While a parallel plate PECVD reactor is specifically mentioned above, the as deposited dielectric film 12 can be deposited from a high density plasma reactor.

The dielectric film 12 formed at this point of the present invention is comprised of two components. The first component is a SiCOH matrix and the second component is the organic porogen. The organic porogen component is interconnected with the SiCOH matrix. The SiCOH matrix is comprised of a hydrogenated oxidized silicon carbon material (SiCOH) comprising atoms of Si, C, O and H in a covalently bonded tri-dimensional network and having a dielectric constant of not more than about 2.8. The tri-bonded network may include a covalently bonded tri-dimensional ring structure comprising Si—O, Si—C, Si—H, C—H and C—C bonds. More preferably, the dielectric constant of the as deposited film 12 is from about 1.5 to about 2.6, and most preferably from about 1.8 to about 2.5.

The SiCOH matrix of the as deposited dielectric film 12 comprises between about 5 and about 40 atomic percent of Si; between about 5 and about 45 atomic percent of C; between 0 and about 50 atomic percent of O; and between about 10 and about 55 atomic percent of H.

After forming the as deposited dielectric film 12 on the substrate 10, the structure shown, for example, in FIG. 1A is subjected to a treatment step that is capable of substantially removing the organic porogen component from the as deposited film 12 thereby forming a SiCOH dielectric material 14 having a dielectric constant that is not greater than 2.7, preferably from about 1.5 to about 2.6, and more preferably from about 1.8 to about 2.5. The structure formed after this treatment step has been performed is shown, for example, in FIG. 1B. Note that the dielectric constant of the SiCOH dielectric material 14 after this treatment step is slightly less than the original dielectric constant of the as deposited dielectric film 12.

The treatment step described herein can be implemented after a single layer deposition or after several deposition steps (multi layer deposition).

Figure 1B:
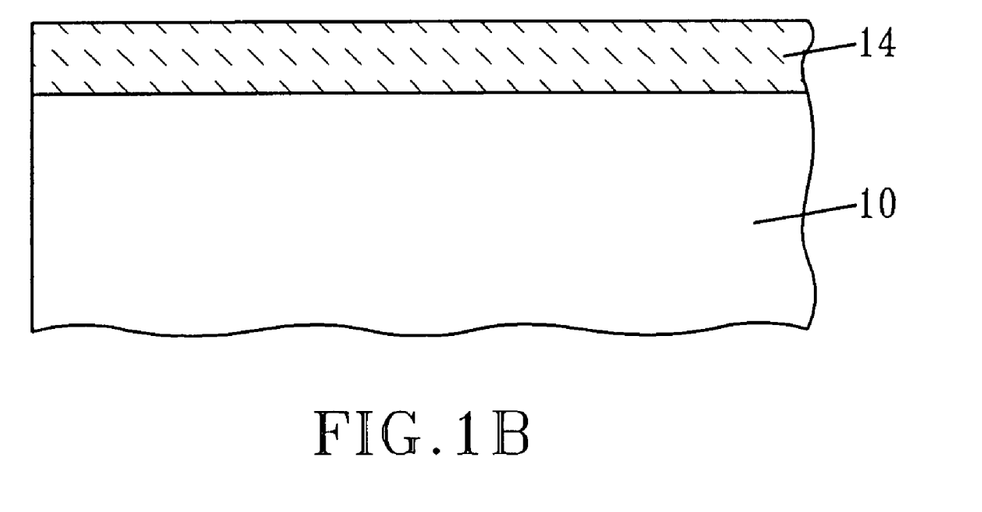

The treatment step performed at this point of the present invention requires sufficient energy to break the organic porogen component present in the as deposited dielectric film 12 from the SiCOH matrix and to remove the porogen from the final film 14. The energy source used for the dissociation may be thermal, electron beam, plasma or optical radiation such as UV or laser. Combinations of the aforementioned energy sources can also be used in the present invention. The removal of the organic porogen is typically associated with additional cross linking of the film.

The thermal energy source includes any source such as, for example, a heating element or a lamp, that can heat the deposited dielectric material to a temperature up to 450° C. More preferably, the thermal energy source is capable of heating the deposited dielectric material to a temperature from about 200° to about 450° C., with a temperature from about 350° C. to about 425° C. being even more preferred. This thermal treatment process can be carried out for various time periods, with a time period from about 0.5 minutes to about 300 minutes being typical. The thermal treatment step is typically performed in the presence of an inert gas such as He, Ar, Ne, Xe, $N_2$ or a mixture thereof. The thermal treatment step may be referred to as an anneal step in which rapid thermal anneal, furnace anneal, laser anneal or spike anneal conditions are employed.

In some embodiments, the thermal treatment step can be performed in the presence of a gas mixture containing a hydrogen source gas such as, for example, $H_2$ or a hydrocarbon. In yet other embodiments, the thermal treatment step can be performed in the presence of a gas mixture containing a very low partial pressure of $O_2$ and $H_2O$, in the range below 1000 parts per million. Curing in an $O_2$ and $H_2O$ ambient is one option to improve the low k film mechanical properties, but it will increase the k value.

The UV light treatment step is performed utilizing a source that can generate light having a wavelength from about 500 to about 150 nm, to irradiate the substrate while the wafer temperature is maintained at up to 450° C., with temperatures from 200° C. –450° C. being preferred and a temperature from 350° C. to 425° C. being even more highly preferred. Radiation with >370 nm is of insufficient energy to dissociate or activate important bonds, so the wavelength range 150-370 nm is a preferred range. Using literature data and absorbance spectra measured on as deposited films, the inventors have found that <170 nm radiation may not be favored due to degradation of the SiCOH film. Further, the energy range 310-370 nm is less useful than the range 150-310 nm, due to the relatively low energy per photon from 310-370 nm. Within the 150-310 nm range, optimum overlap with the absorbance spectrum of the as deposited film and minimum degradation of the film properties (such as hydrophobicity) may be optionally used to select a most effective region of the UV spectrum for changing the SiCOH properties.

The UV light treatment step may be performed in an inert gas, a hydrogen source gas or a gas mixture of $O_2$ and $H_2O$ using the partial pressure range mentioned above.

The electron beam treatment step is performed utilizing a source that is capable of generating a uniform electron flux over the wafer, with energies from 0.5 to 25 keV and current densities from 0.1 to 100 microAmp/$cm^2$ (preferably 1 to 5 microAmp/$cm^2$), while the wafer temperature is maintained at a temperature up to 450° C., with temperatures from 200°-450° C. being preferred, and temperature from 350° to 425° being even more highly preferred. The preferred dose of electrons used in the electron beam treatment step is from 50 to 500 microcoulombs/$cm^2$, with 100 to 300 microcoulombs/$cm^2$ range being preferred.

The electron beam treatment step may be performed in an inert gas, a hydrogen source gas or a gas mixture of $O_2$ and $H_2O$ using the partial pressure range mentioned above.

The plasma treatment step is performed utilizing a source that is capable of generating atomic hydrogen (H), and optionally $CH_3$ or other hydrocarbon radicals. Downstream plasma sources are preferred over direct plasma exposure. During plasma treatment the wafer temperature is maintained at a temperature up to 450° C., with temperatures from 200° C.-450° C. being preferred and temperatures from 350° C. to 425° C. being more highly preferred.

The plasma treatment step is performed by introducing a gas into a reactor that can generate a plasma and thereafter it is converted into a plasma. The gas that can be used for the plasma treatment includes inert gases such as Ar, N, He, Xe or Kr, with He being preferred; hydrogen or related sources of atomic hydrogen, methane, methylsilane, related sources of $CH_3$ groups, and mixtures thereof. The flow rate of the plasma treatment gas may vary depending on the reactor system being used. The chamber pressure can range anywhere from 0.05 to 20 torr, but the preferred range of pressure operation is 1 to 10 torr. The plasma treatment step occurs for a period of time, which is typically from about ½ to about 10 minutes, although longer times may be used within the invention.

An RF or microwave power source is typically used to generate the above plasma. The RF power source may operate at either a high frequency range (on the order of about 100 W or greater); a low frequency range (less than 250 W) or a combination thereof may be employed. The high frequency power density can range anywhere from 0.1 to 2.0 W/cm² but the preferred range of operation is 0.2 to 1.0 W/cm². The low frequency power density can range anywhere from 0.1 to 1.0 W/cm² but the preferred range of operation is 0.2 to 0.5 W/cm². The chosen power levels must be low enough to avoid significant sputter etching of the exposed dielectric surface (<5 nanometers removal).

In addition to the above, a deep ultra-violet (DUV) laser source can also be employed to cause the dissociation of the porogen from the as deposited dielectric film 12. The laser source used to treat the deposited dielectric film 12 is typically an excimer laser which operates at one of several DUV wavelengths depending on the laser gas mixture. For example, a XeF laser which produces 308 nm radiation can be employed. Also, a KrF laser that produces 248 nm radiation, or a ArF laser that produces 193 nm radiation can be employed in the present invention. Excimer lasers can operate at several hundred pulses per second with pulse energies up to a Joule (J) resulting in several hundred Watt (W) output.

The laser employed in treating the as deposited dielectric film 12 preferably operates under a pulse mode. The laser beam can be expanded to expose the entire sample. Alternatively, and for larger samples, the laser exposure area can be raster scanned across the sample to provide uniform dose. Using excimer laser, the fluence is limited to less than 5 mJ/cm² per pulse to ensure ablation will not occur. The short pulse duration of about 10 ns for the excimer laser can cause material ablation at fluence levels greater than 20 mJ/cm².

Typically, laser fluence levels of 0.1-5 mJ/cm² per pulse are employed. The total dose can vary from 1 to 10000 Joules/cm², preferably 500-2000 J/cm². This is achieved by multiple laser pulse exposure. For example, a dose of 1000 J/cm² can be obtained using a fluence of 1 mJ/cm² for a duration of $10^6$ pulses. Excimer laser normally operates at a few hundreds pulses per second. Depending of the total dosage required, the overall exposure time period for the DUV laser treatment for a several seconds to hours. A typical 500 J/cm² dose is achieved in less than 15 min using a 200 Hz laser operating at a fluence level of 3 mJ/cm² per pulse.

Moreover, the SiCOH dielectric film is also characterized as having between about 5 and about 40 atomic percent of Si; between about 5 and about 45 atomic percent of C; between 0 and about 50 atomic percent of O; and between about 10 and about 55 atomic percent of H. The compositional ranges of the atoms in the final film may be slightly below that of the as deposited film 12. The treated SiCOH dielectric film 14 also has other characteristics, e.g., a tri-bonded network, crack velocity in water (on the order of less than $10^{-12}$ meters per second), thermal stability above 350° C., etc, that are similar to the as deposited dielectric film 12.

As stated above, the treated SiCOH dielectric film of the present invention has a uniform atomic and structural composition throughout the entire film in both vertical and horizontal directions. Moreover, the inventive film, i.e., the treated SiCOH dielectric film 14 is more stable than conventional SiCOH films that are formed from two precursors.

The SiCOH dielectric film 14 has a controlled porosity having molecular scale voids (i.e., nanometer-sized pores) of between about 0.5 to about 20 nanometers in diameter, and preferably from about 0.5 to about 5 nm in diameter. According to the invention, the molecular scale voids occupy a volume of between about 5% and about 60%. Also according to the invention, the dielectric material of this invention contains molecular scale voids that are characterized by a pore size distribution and said size distribution has a maximum (in the distribution) between, 0.7 and 3 nm, and preferably between, 0.7 and 2.5 nm.

In addition, the inventive SiCOH dielectric film 14 has improved mechanical properties at the same values of dielectric constant. For example, for an inventive film having a thickness of about 1-2 μm the following properties were measured: a low film stress (on the order of about 15-26 MPa), a low crack velocity (on the order of less than 1E-10 m/sec), a modulus from about 3 to about 3.8 GPa, and a hardness from about 0.2 to about 0.24 GPa.

Table 1 shows physical properties for other SiCOH dielectric films having the thickness mentioned in the table.

TABLE 1

Single Precursor SiCOH Film Evaluation

| Sample Thickness (μm) | Stress (MPa) | Crack Velocity (m/sec) | Modulus (GPa) | Hardness (GPa) | Comment |
|---|---|---|---|---|---|
| 1.1-1.3 | 26 +/− 5 | 5.6E-11 | 3.62 +/− 0.7 | 0.23 +/− 0.05 | k = 2.52-2.6 |
| 1.25 | 26 +/− 5 | <1E-10 | 3.61 +/−0.12 | 0.23 +/− 0.01 | k = 2.52-2.55; top 100 nm soft |
| 1.85 | 26 +/− 5 | <1E-10 | 3.65 +/− 0.01 | 0.24 | k = 2.52-2.55; top 100 nm soft |
| 1.88 | 26 +/− 5 | <10E-10 | 3.78 +/− 0.11 | 0.23 +/− 0.01 | k = 2.52-2.55 |
| 0.7-1.2 | 17 +/− 5 | 9.7E-11 | 3.34 +/− 0.08 | 0.20 +/− 0.006 | k = 2.6 |
| 1.4-2.6 | 14 +/− 4 | 1.2E-10, no growth | 2.94 +/− 0.004 | 0.18 +/− 0.004 | k = 2.6 |

The SiCOH dielectric film 14 of the present invention may be used as the interlevel and/or intralevel dielectric, a capping layer, and/or as a hard mask/polish-stop layer in electronic structures.

The electronic structure of the present invention includes a pre-processed semiconducting substrate that has a first region of metal embedded in a first layer of insulating material, a first region of conductor embedded in a second layer of insulating material, the second layer of insulating material being in intimate contact with the first layer of insulating material, the first region of conductor being in electrical communication with the first region of metal, and a second region of conductor being in electrical communication with the first region of conductor and being embedded in a third layer of insulating material, the third layer of insulating material being in intimate contact with the second layer of insulating material.

In the above structure, each of the insulating layers can comprise the inventive SiCOH dielectric film 14.

The electronic structure may further include a dielectric cap layer situated in-between the first layer of insulating material and the second layer of insulating material, and may further include a dielectric cap layer situated in-between the second layer of insulating material and the third layer of insulating material. The electronic structure may further include a first dielectric cap layer between the second layer of insulating material and the third layer of insulating material, and a second dielectric cap layer on top of the third layer of insulating material.

The dielectric cap material can be selected from silicon oxide, silicon nitride, silicon oxynitride, silicon carbon nitride (SiCN), refractory metal silicon nitride with the refractory metal being Ta, Zr, Hf or W, silicon carbide, silicon carbo-oxide, carbon doped oxides and their hydrogenated or nitrided compounds. In some embodiments, the dielectric cap itself can comprise the inventive treated SiCOH dielectric material. The first and the second dielectric cap layers may be selected from the same group of dielectric materials. The first layer of insulating material may be silicon oxide or silicon nitride or doped varieties of these materials, such as PSG or BPSG.

The electronic structure may further include a diffusion barrier layer of a dielectric material deposited on at least one of the second and third layer of insulating material. The electronic structure may further include a dielectric layer on top of the second layer of insulating material for use as a RIE hard mask/polish-stop layer and a dielectric diffusion barrier layer on top of the dielectric RIE hard mask/polish-stop layer. The electronic structure may further include a first dielectric RIE hard mask/polish-stop layer on top of the second layer of insulating material, a first dielectric RIE diffusion barrier layer on top of the first dielectric polish-stop layer a second dielectric RIE hard mask/polish-stop layer on top of the third layer of insulating material, and a second dielectric diffusion barrier layer on top of the second dielectric polish-stop layer. The dielectric RIE hard mask/polish-stop layer may be comprised of the inventive SiCOH dielectric material 14 as well.

The electronic devices which can contain the inventive treated SiCOH dielectric film are shown in FIGS. 2-5. It should be noted that the devices shown in FIGS. 2-5 are merely illustrative examples of the present invention, while an infinite number of other devices may also be formed by the present invention novel methods.

Figure 2:
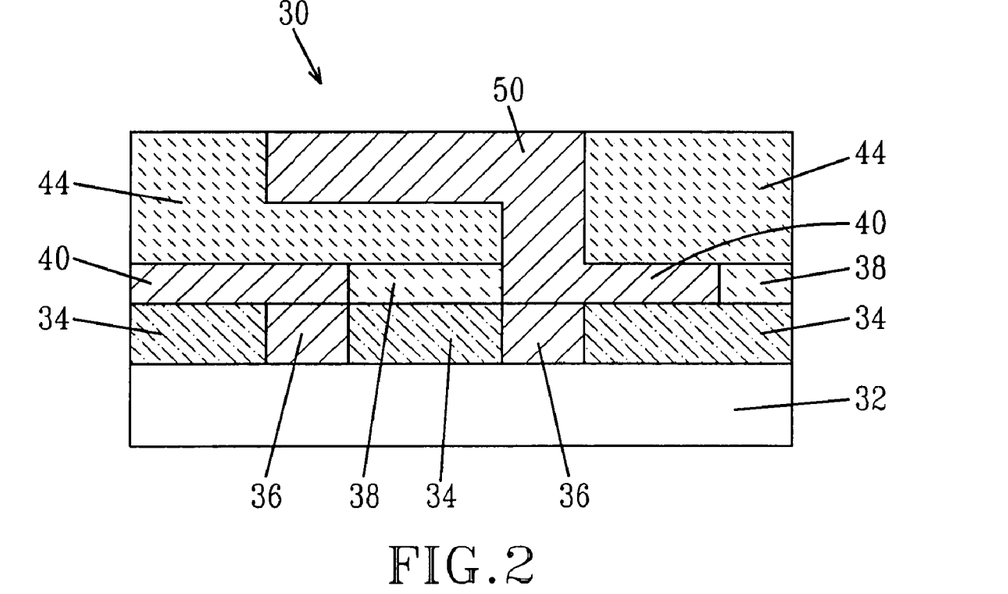
FIG. 2 is an enlarged, cross-sectional view of an electronic device of the present invention that includes the inventive SiCOH dielectric film as both the intralevel dielectric layer and the interlevel dielectric layer.

In FIG. 2, an electronic device 30 built on a semiconductor substrate 32 is shown. On top of the semiconductor substrate 32, an insulating material layer 34 is first formed with a first region of metal 36 embedded therein. After a CMP process is conducted on the first region of metal 36, a treated SiCOH dielectric film 38 of the present invention is formed on top of the first layer of insulating material 34 and the first region of metal 36. The first layer of insulating material 34 may be suitably formed of silicon oxide, silicon nitride, doped varieties of these materials, or any other suitable insulating materials. The treated SiCOH dielectric film 38 is then patterned in a photolithography process followed by etching and a conductor layer 40 is deposited thereon. After a CMP process on the first conductor layer 40 is carried out, a second layer of the inventive treated SiCOH film 44 is deposited by a plasma enhanced chemical vapor deposition process overlying the first treated SiCOH dielectric film 38 and the first conductor layer 40. The conductor layer 40 may be a deposit of a metallic material or a nonmetallic conductive material. For instance, a metallic material of aluminum or copper, or a nonmetallic material of nitride or polysilicon. The first conductor 40 is in electrical communication with the first region of metal 36.

A second region of conductor 50 is then formed after a photolithographic process on the treated SiCOH dielectric film 44, followed by etching and then a deposition process for the second conductor material. The second region of conductor 50 may also be a deposit of either a metallic material or a nonmetallic material, similar to that used in depositing the first conductor layer 40. The second region of conductor 50 is in electrical communication with the first region of conductor 40 and is embedded in the second layer of the treated SiCOH dielectric film 44. The second layer of the treated SiCOH dielectric film 44 is in intimate contact with the first layer of the treated SiCOH dielectric material 38. In this example, the first layer of the treated SiCOH dielectric film 38 is an intralevel dielectric material, while the second layer of the treated SiCOH dielectric film 44 is both an intralevel and an interlevel dielectric.

Figure 3:
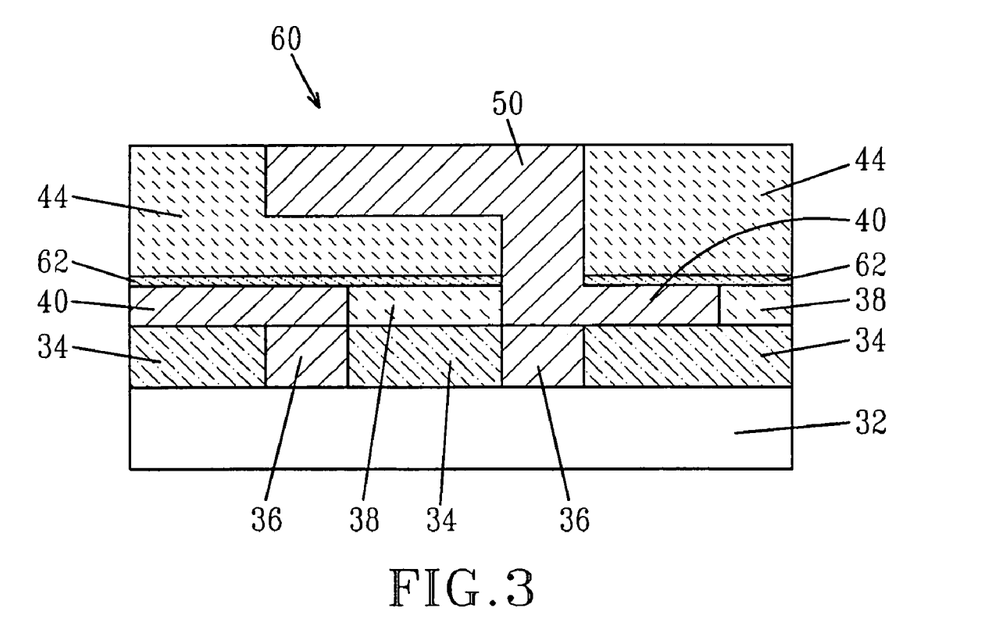
FIG. 3 is an enlarged, cross-sectional view of the electronic structure of FIG. 2 having an additional diffusion barrier dielectric cap layer deposited on top of the inventive SiCOH dielectric film.

FIG. 3 shows a present invention electronic device 60 similar to that of electronic device 30 shown in FIG. 2, but with an additional dielectric cap layer 62 deposited between the first insulating material layer 38 and the second insulating material layer 44. The dielectric cap layer 62 can be suitably formed of a material such as silicon oxide, silicon nitride, silicon oxynitride, refractory metal silicon nitride with the refractory metal being Ta, Zr, Hf or W, silicon carbide, silicon carbo-nitride (SiCN), silicon carbo-oxide (SiCO), and their hydrogenated compounds. The additional dielectric cap layer 62 functions as a diffusion barrier layer for preventing diffusion of the first conductor layer 40 into the second insulating material layer 44 or into the lower layers, especially into layers 34 and 32.

Figure 4:
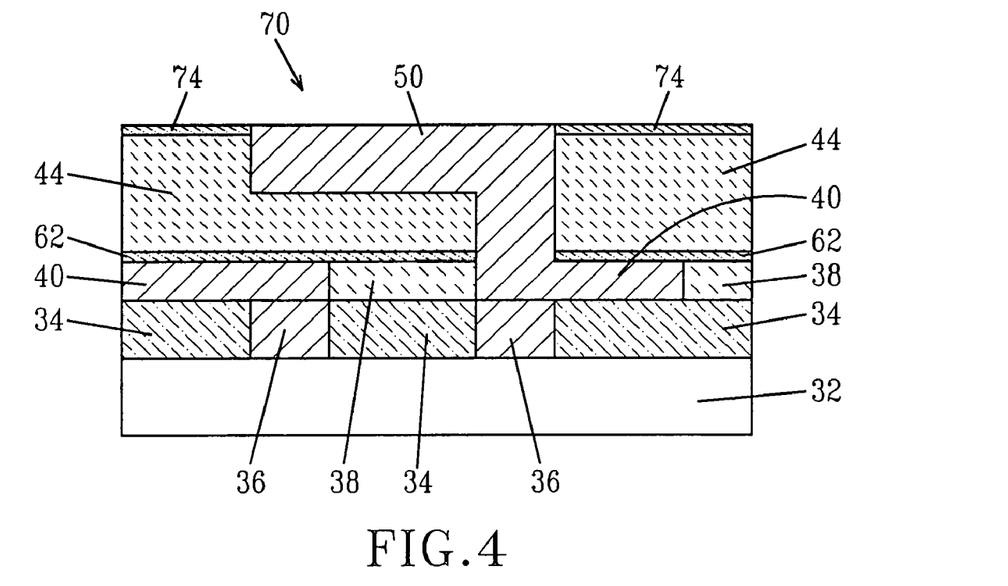
FIG. 4 is an enlarged, cross-sectional view of the electronic structure of FIG. 3 having an additional RIE hard mask/polish-stop dielectric cap layer and a dielectric cap diffusion barrier layer deposited on top of the polish-stop layer.

Another alternate embodiment of the present invention electronic device 70 is shown in FIG. 4. In the electronic device 70, two additional dielectric cap layers 72 and 74 which act as a RIE mask and CMP (chemical mechanical polishing) polish stop layer are used. The first dielectric cap layer 72 is deposited on top of the first treated SiCOH dielectric material 38 and used as a RIE mask and CMP stop, so the first conductor layer 40 and layer 72 are approximately coplanar after CMP. The function of the second dielectric layer 74 is similar to layer 72, however layer 74 is utilized in planarizing the second conductor layer 50. The polish stop layer 74 can be a deposit of a suitable dielectric material such as silicon oxide, silicon nitride, silicon oxynitride, refractory metal silicon nitride with the refractory metal being Ta, Zr, Hf or W, silicon carbide, silicon carbo-oxide (SiCO), and their hydrogenated compounds. A preferred polish stop layer composition is SiCH or SiCOH for layers 72 or 74. When layer 72 is comprised of SiCOH, it is preferred that the inventive treated SiCOH film be employed. A second dielectric layer 74 can be added on top of the second treated SiCOH dielectric film 44 for the same purposes.

Figure 5:
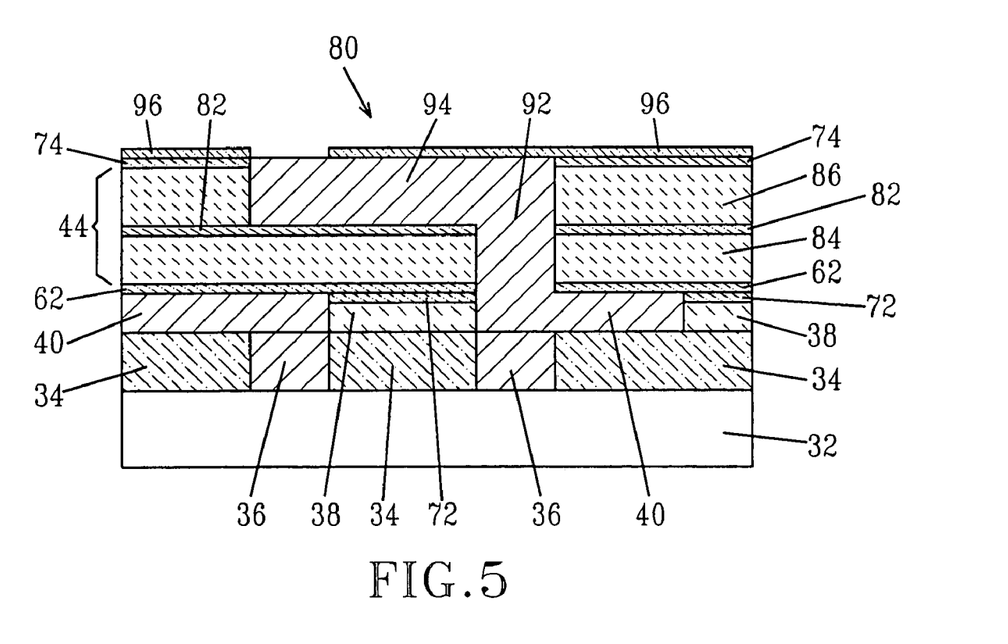
FIG. 5 is an enlarged, cross-sectional view of the electronic structure of FIG. 4 having additional RIE hard mask/polish-stop dielectric layers deposited on top of the SiCOH dielectric film of the present invention.

Still another alternate embodiment of the present invention electronic device 80 is shown in FIG. 5. In this alternate embodiment, an additional layer 82 of dielectric material is deposited and thus dividing the second insulating material layer 44 into two separate layers 84 and 86. The intralevel and interlevel dielectric layer 44 formed of the inventive treated SiCOH dielectric film, shown in FIG. 2, is therefore divided into an interlayer dielectric layer 84 and an intralevel dielectric layer 86 at the boundary between via 92 and interconnect 94. An additional diffusion barrier layer 96 is further deposited on top of the upper dielectric layer 74. The additional benefit provided by this alternate embodiment electronic structure 80 is that dielectric layer 82 acts as an RIE etch stop providing superior interconnect depth control. Thus, the composition of layer 82 is selected to provide etch selectivity with respect to layer 86.

Still other alternate embodiments may include an electronic structure which has layers of insulating material as intralevel or interlevel dielectrics in a wiring structure that includes a pre-processed semiconducting substrate which has a first region of metal embedded in a first layer of insulating material, a first region of conductor embedded in a second layer of the insulating material wherein the second layer of insulating material is in intimate contact with the first layer of insulating material, and the first region of conductor is in electrical communication with the first region of metal, a second region of conductor in electrical communication with the first region of conductor and is embedded in a third layer of insulating material, wherein the third layer of insulating material is in intimate contact with the second layer of insulating material, a first dielectric cap layer between the second layer of insulating material and the third layer of insulating material and a second dielectric cap layer on top of the third layer of insulating material, wherein the first and the second dielectric cap layers are formed of a material that includes the inventive SiCOH dielectric film.

Still other alternate embodiments of the present invention include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor that is in electrical communication with the first region of conductor and is embedded in a third layer of insulating material, the third layer of insulating material is in intimate contact with the second layer of insulating material, and a diffusion barrier layer comprise the SiCOH film of the present invention formed on at least one of the second and third layers of insulating material.

Still other alternate embodiments include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a reactive ion etching (RIE) hard mask/polish stop layer on top of the second layer of insulating material, and a diffusion barrier layer on top of the RIE hard mask/polish stop layer, wherein the RIE hard mask/polish stop layer and the diffusion barrier layer comprise the SiCOH dielectric film of the present invention.

Still other alternate embodiments include an electronic structure which has layers of insulating materials as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a first RIE hard mask, polish stop layer on top of the second layer of insulating material, a first diffusion barrier layer on top of the first RIE hard mask/polish stop layer, a second RIE hard mask/polish stop layer on top of the third layer of insulating material, and a second diffusion barrier layer on top of the second RIE hard mask/polish stop layer, wherein the RIE hard mask/polish stop layers and the diffusion barrier layers comprise the treated SiCOH dielectric film of the present invention.

Still other alternate embodiments of the present invention includes an electronic structure that has layers of insulating material as intralevel or interlevel dielectrics in a wiring structure similar to that described immediately above but further includes a dielectric cap layer which comprises the treated SiCOH dielectric material of the present invention situated between an interlevel dielectric layer and an intralevel dielectric layer.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a dielectric film comprising:
positioning a substrate in a plasma enhanced chemical vapor deposition (PECVD) reactor;
providing a single organosilicon precursor with a built-in organic porogen into said PECVD reactor in the absence of another porogen source, said single organosilicon precursor with a built-in organic porogen is selected from the group consisting of vinylmethyldiethoxysilane, vinyltriethoxysilane, vinyldimethylethoxysilane, hexavinyldisiloxane, trivinylmethoxysilane, trivinylethoxysilane, vinylmethylethoxysilane, vinylmethyldiethoxysilane, vinylmethyldimethoxysilane, vinylpentamethyldisiloxane, vinyltetramethyldisiloxane, and vinyltrimethoxysilane;
forming an as-deposited film from said single organsilicon precursor on said substrate, said as-deposited film comprising a SiCOH matrix component and an organic porogen component; and
performing a treatment step that substantially removes said organic porogen component from said as-deposited film, said treatment step conducted in the presence of an atmosphere selected from the group consisting of an inert gas and a hydrogen source and an inert gas, oxygen and water, thereby providing a porous SiCOH dielectric material having a dielectric constant of about 2.7 or lower, said SiCOH dielectric material having a covalently bonded tri-dimensional network structure, a controlled porosity having molecular scale voids of between about 0.5 to about 20 nanometers in diameter, said molecular scale voids occupying a volume of between about 5% and about 60%, a crack velocity in water on the order of less than $10^{-10}$ meters per second and is thermally stable above 350° C.

2. The method of claim 1 further comprising mixing an inert gas with said single organosilicon precursor with a built-in porogen.

3. The method of claim 1 further comprising mixing an oxidizing agent with said single organosilicon precursor with a built-in porogen.

4. The method of claim 1 wherein said substrate is a semiconducting material, an insulating material, a conductive material or a combination, including multilayers, thereof.

5. The method of claim 1 wherein said SiCOH matrix component and said organic porogen component are covalently bonded.

6. The method of claim 5 wherein said treatment step comprises selecting an energy source that is capable of dissociating said organic porogen component from said SiCOH matrix component, wherein said energy source comprises thermal, electron beam, plasma, UV, DUV or laser.

7. The method of claim 6 wherein said energy source is thermal and said thermal source is capable of providing a temperature up to 450° C.

8. The method of claim 7 wherein said thermal energy source is an annealing process that is performed in the presence of an inert gas and a hydrogen source.

9. The method of claim 7 wherein said thermal energy source is an annealing process that is conducted in the presence of an atmosphere that is an inert gas, oxygen and water wherein the partial pressure of $O_2$ and $H_2O$ are below 1000 ppm.

10. The method of claim 6 wherein said energy source comprises UV or DUV light that can generate light having a wavelength from about 500 to about 150 nm.

11. The method of claim 6 wherein said energy source comprises a UV or DUV light treatment conducted in the presence of said inert gas and hydrogen source.

12. The method of claim 6 wherein said energy source is a UV light treatment conducted in the presence of an inert gas, oxygen and water atmosphere wherein the partial pressure of $O_2$ and $H_2O$ are below 1000 ppm.

13. The method of claim 1 wherein said steps are incorporated within a process for fabricating an interconnect structure in an electronic device.

14. The method of claim 1 wherein said hydrogen source is hydrogen or a hydrocarbon.

15. The method of claim 1 wherein the built-in organic porogen present in the single organosilicon precursor is a silicon-containing component.

16. A method of forming a dielectric film comprising:
positioning a substrate in a plasma enhanced chemical vapor deposition (PECVD) reactor;
providing a single organosilicon precursor including a silicon containing organic porogen into said PECVD reactor, said single organosilicon precursor with a built-in organic porogen comprising a silane derivative having the molecular formula $SiRR^1R^2R^3$, a disiloxane derivative having the molecular formula $R^4R^5R^6$—Si—O—Si—$R^7R^8R^9$, or a trisiloxane derivative having the molecular formula $R^{10}R^{11}R^{12}$—Si—O—Si—$R^{13}R^{14}$—O—Si—$R^{15}R^{16}R^{17}$ where R and $R^{1-17}$ may or may not be identical and are selected from H, alkyl, alkoxy, epoxy, phenyl, vinyl, allyl, alkenyl or alkynyl groups that may be linear, branched, cyclic, polycyclic and may be functionalized with oxygen, nitrogen or fluorine containing substituents;
forming an as-deposited film from said single organsilicon precursor on said substrate, said as deposited film comprising a SiCOH matrix component and an organic porogen component; and
performing a treatment step that substantially removes said organic porogen component from said as deposited film thereby providing a SiCOH dielectric material having a dielectric constant of about 2.7 or lower.

* * * * *